United States Patent
Aga et al.

(10) Patent No.: US 9,581,810 B2
(45) Date of Patent: Feb. 28, 2017

(54) PIEZOELECTRIC ACTUATOR AND OPTICAL SCANNING APPARATUS HAVING A PLURALITY OF PIEZOELECTRIC LAYERS

(71) Applicants: Hisanori Aga, Tokyo (JP); Ayu Sugiyama, Tokyo (JP)

(72) Inventors: Hisanori Aga, Tokyo (JP); Ayu Sugiyama, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 327 days.

(21) Appl. No.: 14/032,732

(22) Filed: Sep. 20, 2013

(65) Prior Publication Data
US 2014/0085694 A1    Mar. 27, 2014

(30) Foreign Application Priority Data

Sep. 27, 2012  (JP) .................... 2012-213500
Aug. 26, 2013  (JP) .................... 2013-174661

(51) Int. Cl.
*G02B 26/10* (2006.01)
*H01L 41/047* (2006.01)
(Continued)

(52) U.S. Cl.
CPC .......... *G02B 26/10* (2013.01); *G02B 26/0858* (2013.01); *G02B 26/101* (2013.01);
(Continued)

(58) Field of Classification Search
CPC ... G02B 6/3564; G02B 6/3578; G02B 6/3584; G02B 26/0833; G02B 26/0841; G02B 26/085; G02B 26/0858; G02B 26/0866; B81C 1/00; B81C 1/00134; B81C 1/00103; B81C 1/00111; B81C 1/00119; B81C 1/00126
(Continued)

(56) References Cited

U.S. PATENT DOCUMENTS 7,288,877 B2 * 10/2007 Kita .................... B25J 7/00
                                                    310/359
2007/0228887 A1 * 10/2007 Nishigaki .......... B81B 3/0072
                                                    310/332
(Continued)

FOREIGN PATENT DOCUMENTS

JP  2007-165553   6/2007
JP  2008-111881   5/2008
(Continued)

OTHER PUBLICATIONS

S. Ezhilvalavan, Victor D Samper, and Jackie Y. Ying; Fabrication of PbLa 0.05 TiO 3/Pb 1.20 ( Zr 0.52 Ti 0.48 ) O 3/PbLa 0.05 TiO 3 ferroelectric structure on platinum electrodes by a sol-gel process; 2005; Applied Physics Letters; 87, 252907, 1-3.*
(Continued)

*Primary Examiner* — Scott J Sugarman
*Assistant Examiner* — Robert E Tallman
(74) *Attorney, Agent, or Firm* — IPUSA, PLLC

(57) ABSTRACT

A piezoelectric actuator includes a plurality of piezoelectric layers, a plurality of electrodes between which each of the piezoelectric layers is placed so that the electrodes and the piezoelectric layers alternate with each other, and a substrate on which the plurality of piezoelectric layers and the plurality of electrodes are formed.

9 Claims, 10 Drawing Sheets

(51) Int. Cl.
*G02B 26/08* (2006.01)
*H01L 41/09* (2006.01)

(52) U.S. Cl.
CPC ...... *H01L 41/0471* (2013.01); *H01L 41/0477* (2013.01); *H01L 41/094* (2013.01)

(58) Field of Classification Search
USPC ............. 359/196.1, 197.1, 198.1, 199.1, 199.2,359/200.6, 212.1, 212.2, 213.1, 214.1, 220.1,359/223, 224.1, 223.1
See application file for complete search history.

(56) References Cited

U.S. PATENT DOCUMENTS

| | | |
|---|---|---|
| 2009/0045704 A1 | 2/2009 | Barber et al. |
| 2010/0245966 A1* | 9/2010 | Yasuda ............... H01L 41/0953 359/224.1 |
| 2012/0162739 A1 | 6/2012 | Yamada |
| 2013/0229465 A1 | 9/2013 | Fujii et al. |

FOREIGN PATENT DOCUMENTS

| | | |
|---|---|---|
| JP | 2011-170196 | 9/2011 |
| JP | 2011-217447 | 10/2011 |
| JP | 2012-133242 | 7/2012 |
| JP | 2013-080887 | 5/2013 |

OTHER PUBLICATIONS

Japanese Office Action dated Jun. 28, 2016 with English translation.

* cited by examiner

PIEZOELECTRIC ACTUATOR AND OPTICAL SCANNING APPARATUS HAVING A PLURALITY OF PIEZOELECTRIC LAYERS

BACKGROUND OF THE INVENTION

1. Field of the Invention

The disclosures herein relate to a piezoelectric actuator and an optical scanning apparatus having a piezoelectric actuator.

2. Description of the Related Art

Piezoelectric actuators utilizing the characteristics of piezoelectric material that exhibits deformation in response to application of voltage have been known in the art.

Related-art actuators have piezoelectric material provided on a substrate as disclosed in Patent Document 1, for example. A piezoelectric device includes piezoelectric material and a pair of electrodes between which the piezoelectric material is placed. Drive voltage is applied to the pair of electrodes to deform the piezoelectric material.

Various electronic devices of today are required to have low power conservation. Reduction in power consumption is also required in electronic devices having piezoelectric actuators, for example. As a result, reduction in the drive voltage of piezoelectric actuators is also required.

Accordingly, there may be a need to provide a piezoelectric actuator and an optical scanning apparatus for which drive voltage can be reduced.

RELATED-ART DOCUMENTS

Patent Document

[Patent Document 1] Japanese Patent Application Publication No. 2011-217447

SUMMARY OF THE INVENTION

It is a general object of the present invention to provide a piezoelectric actuator and an optical scanning apparatus that substantially obviate one or more problems caused by the limitations and disadvantages of the related art.

A piezoelectric actuator includes a plurality of piezoelectric layers, a plurality of electrodes between which each of the piezoelectric layers is placed so that the electrodes and the piezoelectric layers alternate with each other, and a substrate on which the plurality of piezoelectric layers and the plurality of electrodes are formed.

An optical scanning apparatus for rotationally swinging a mirror support part supporting a mirror around a rotational axis through twist of twist beams that support the mirror support part on both ends thereof on the rotational axis includes two first drive beams disposed on respective sides of the mirror and the mirror support part, connection beams configured to connect one side of each of the first drive beams to the twist beams, a movable frame configured to surround the mirror, the mirror support part, the twist beams, the first drive beams, and the connection beams, and first drive units disposed on the first drive beams, respectively, wherein each the first drive units includes a plurality of piezoelectric layers, a plurality of electrodes between which each of the piezoelectric layers is placed so that the electrodes and the piezoelectric layers alternate with each other, and a substrate on which the plurality of piezoelectric layers and the plurality of electrodes are formed.

According to at least one embodiment, drive voltage is reduced.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

First Embodiment

Figure 1:
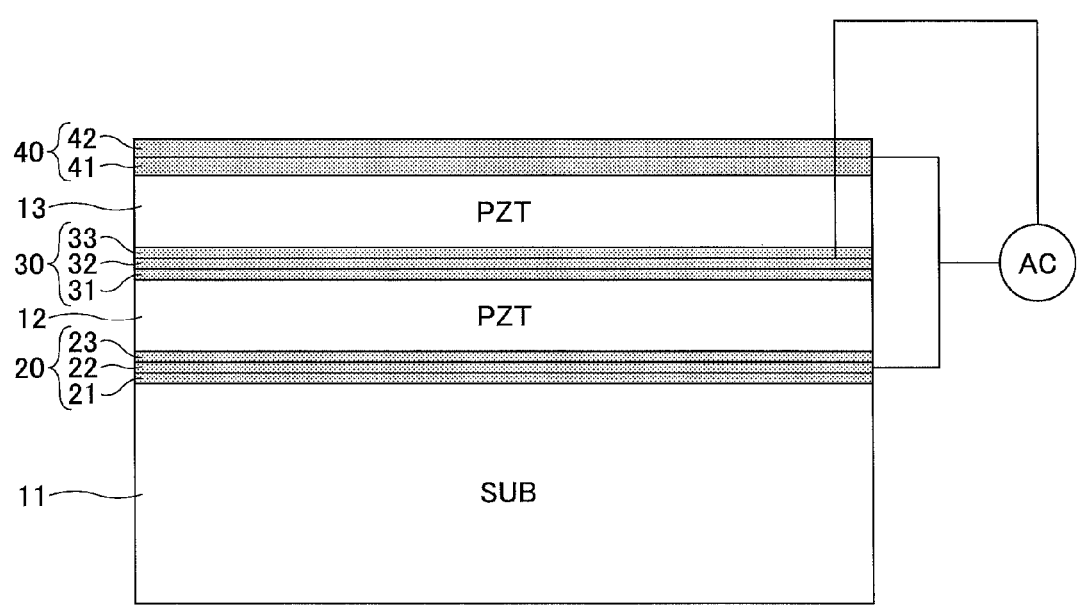
FIG. 1 is a drawing illustrating the configuration of a piezoelectric actuator according to a first embodiment.

In the following, a first embodiment will be described with reference to the accompanying drawings. FIG. 1 is a drawing illustrating the configuration of a piezoelectric actuator according to the first embodiment.

A piezoelectric actuator 10 of the present embodiment includes a lower electrode 20 formed on a substrate 11 and a piezoelectric material 12 formed on the lower electrode 20. The piezoelectric actuator 10 of the present embodiment further includes a middle electrode 30 formed on the piezoelectric material 12, a piezoelectric material 13 formed on the middle electrode 30, and an upper electrode 40 formed on the piezoelectric material 13.

The piezoelectric actuator 10 is configured such that the middle electrode 30 is coupled to the ground, and the upper electrode 40 and the lower electrode 20 receive a drive signal for driving the piezoelectric actuator 10. The upper electrode 40 and the lower electrode 20 are displaced in response to the voltage of the drive signal as it is supplied thereto.

The lower electrode 20 of the present embodiment is a film comprised of three layers. The lower electrode 20 of the present embodiment includes a first layer 21, a second layer 22, and a third layer 23. In the lower electrode 20 of the present embodiment, the first layer 21 and the third layer 23 are LNO (LaNiO3) layers, each of which may be 30 nm in thickness. The second layer 22 of the present embodiment is a Pt thin film, which may be 150 nm in thickness.

Similarly, the middle electrode 30 of the present embodiment is a film comprised of three layers. The middle electrode 30 of the present embodiment includes a first layer 31, a second layer 32, and a third layer 33. In the middle electrode 30 of the present embodiment, the first layer 31 and the third layer 33 are LNO (LaNiO3) layers, each of which may be 80 nm in thickness. The second layer 32 of the present embodiment is a Pt thin film, which may be 150 nm in thickness. As noted above, the first layer 31 and the third layer 33 of the middle electrode 30 of the present embodiment have a film thickness of 80 nm, which is not a limiting example. The film thickness of the first layer 31 and the third layer 33 may be 30 nm or more. This thickness of 30 nm is required to evenly grow an LNO thin film.

The upper electrode 40 of the present embodiment is a film comprised of two layers. The upper electrode 40 of the present embodiment includes a first layer 41 and a second layer 42. In the upper electrode 40 of the present embodiment, the first layer 41 is an LNO (LaNiO3) layer, which may be 80 nm in thickness. The second layer 42 is a Pt thin film, which may be 100 nm in thickness.

The specific configuration of the present embodiment in which the first layers 21, 31 and 41 and the third layers 23 and 33 are LNO (LaNiO3) thin films, and the second layers 22, 32 and 42 are Pt thin films is not a limiting example. It suffices for the first layers 21, 31 and 41 and the third layers 23 and 33 to be a thin film including a perovskite structure and the (110) orientation. SRO (Sr2RuO4) may be used for these layers. The second layers 22, 32 and 42 may be a platinum group metal that is not Pt, and may be a thin film made of Ir, Os, or the like.

The piezoelectric materials 12 and 13 of the present embodiment are PZT (Lead titanium zirconium oxide) thin films. The piezoelectric material 12 and the piezoelectric material 13 are formed on the lower electrode 20 and the middle electrode 30, respectively, by use of the sol-gel process. The substrate 11 of the present embodiment is a silicon substrate.

In the present embodiment, for the purpose of crystallizing the piezoelectric material 12 and the piezoelectric material 13 formed on the lower electrode 20 and the middle electrode 30, respectively, the lower electrode 20 and the middle electrode 30 are formed by sputtering such that the crystal orientation in the vertical direction in the LNO surface is oriented predominantly in the (110) orientation by raising the temperature of the substrate 11 to more than 500 degrees Celsius. The lower electrode 20 and the middle electrode 30 of the present embodiment are formed in the above-noted condition for the purpose of crystallizing the PZT thin films to achieve satisfactory piezoelectric characteristics, thereby allowing a drive voltage to be reduced.

The third layer 23 of the lower electrode 20 and the third layer 33 of the middle electrode 30 in the present embodiment facilitate crystallization of the piezoelectric material 12 and the piezoelectric material 13 formed thereon. The first layer 31 of the middle electrode 30 and the first layer 41 of the upper electrode 40 in the present embodiment serve to suppress oxidization of the piezoelectric material 12 and the piezoelectric material 13 formed therebeneath.

Figure 2:
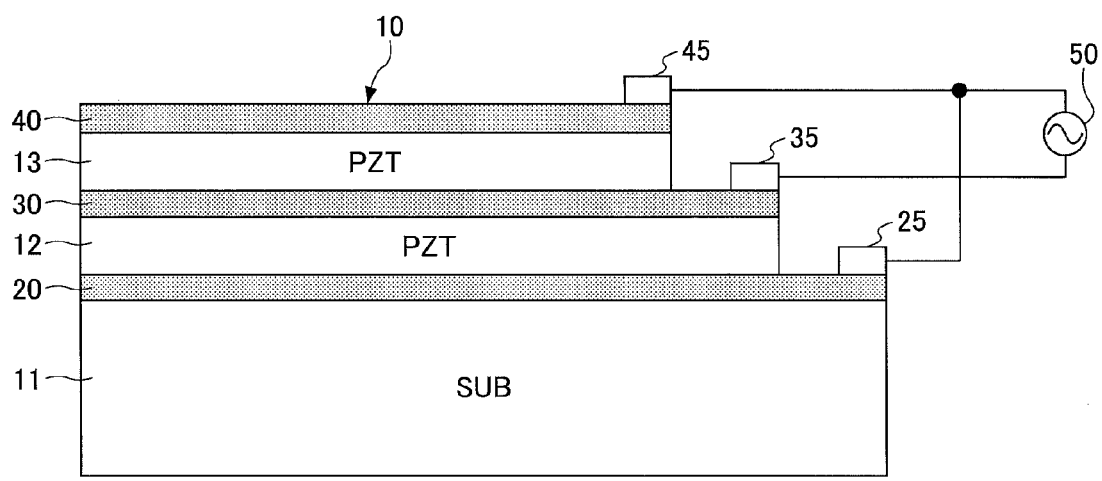
FIG. 2 is a drawing illustrating the piezoelectric actuator that is used to evaluate dielectric characteristics.

In the following, a description will be given of the dielectric characteristics of the piezoelectric actuator 10 according to the present embodiment. FIG. 2 is a drawing illustrating the piezoelectric actuator that is used to evaluate dielectric characteristics.

In the present embodiment, dielectric characteristics are evaluated by connecting the electrodes of the piezoelectric actuator 10 as illustrated in FIG. 2. In the piezoelectric actuator illustrated in FIG. 2, connection-purpose electrodes 25, 35 and 45 are formed on the lower electrode 20, the middle electrode 30, and the upper electrode 40, respectively. In the example illustrated in FIG. 2, an AC power supply 50 connects between the electrode 35 and a connection point between the electrode 25 and the electrode 45. The AC power supply 50 applies a drive voltage to the piezoelectric actuator 10.

Figure 3:
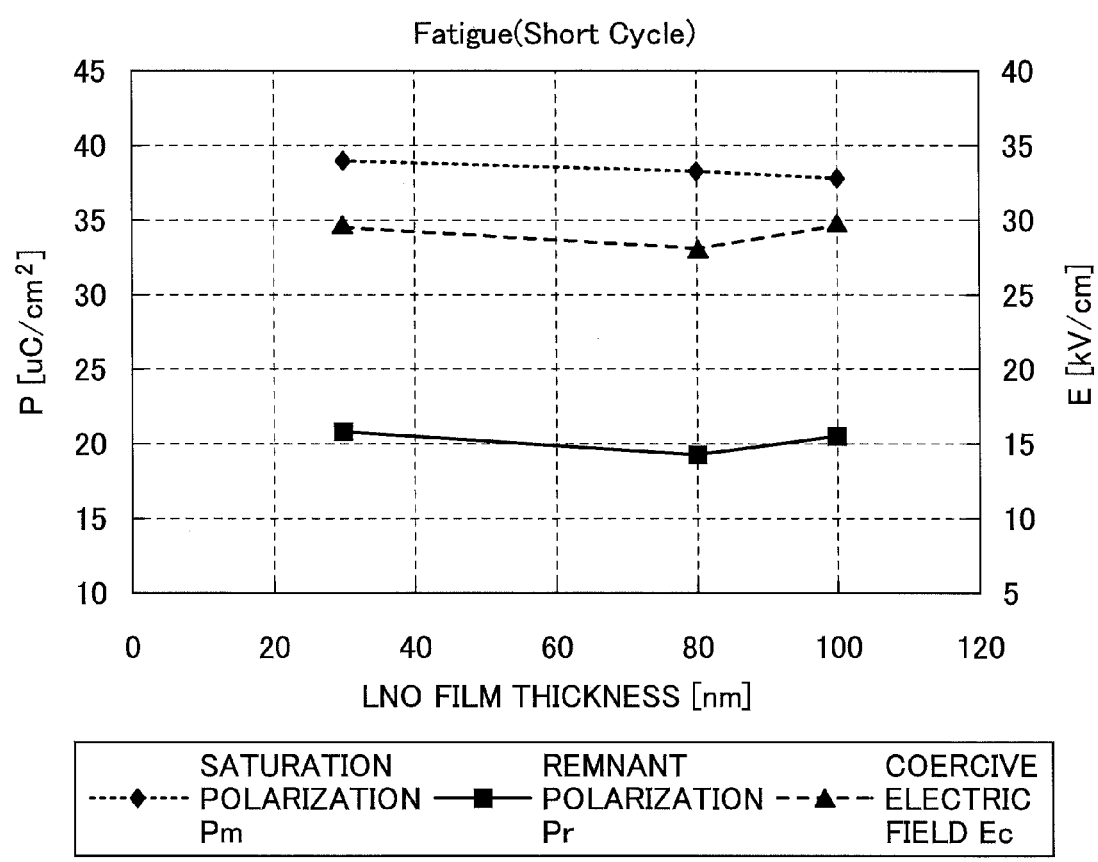
FIG. 3 is a drawing illustrating dielectric characteristics that are observed when the thickness of LNO thin films of the piezoelectric actuator is changed.

FIG. 3 is a drawing illustrating dielectric characteristics that are observed when the thickness of the LNO thin films of the piezoelectric actuator is changed. In the present embodiment, changes in the saturation polarization Pm, remnant polarization Pr, and coercive electric field Ec of the piezoelectric actuator 10 are small when the thickness of the LNO thin films is in a range of 30 nm to 100 nm, which is regarded as an indication of stable dielectric characteristics.

In consideration of the above, the thickness of the LNO thin films in the present embodiment is set equal to 30 nm which is the lower end of a range of 30 nm to 100 nm. It suffices for the film thickness of the LNO thin films of the present embodiment to be within a range between 30 nm and 100 nm.

Figure 4:
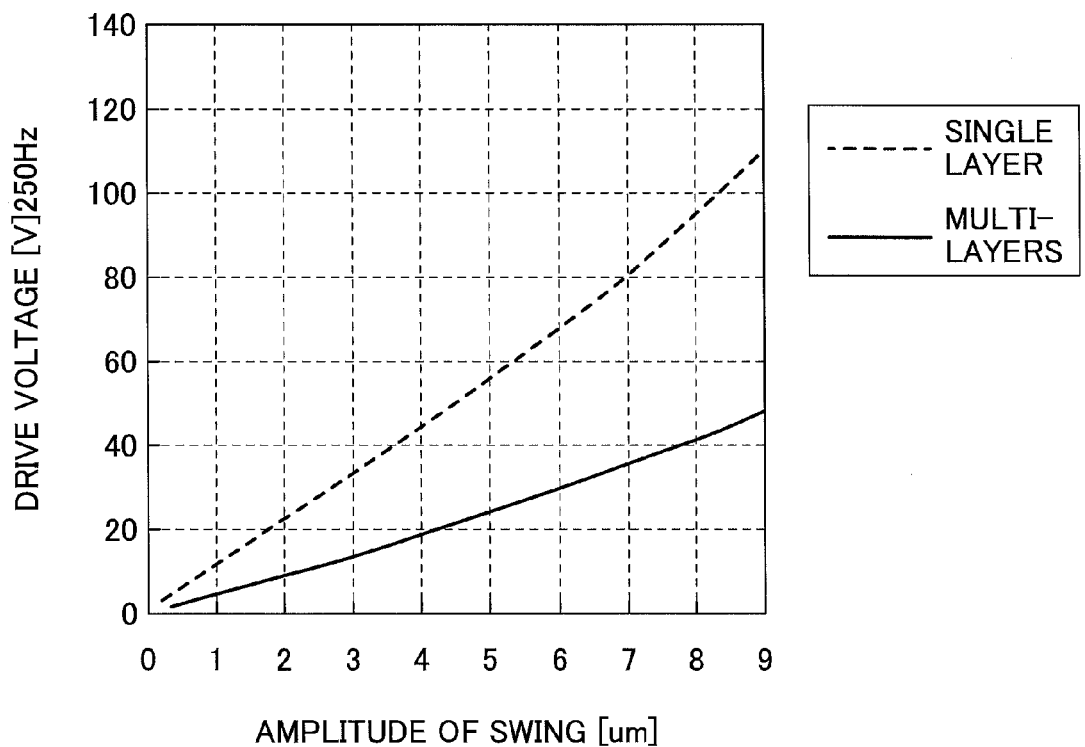
FIG. 4 is a drawing illustrating the relationship between drive voltage and displacement.

In the following, a description will be given of displacement and drive voltage applied to the piezoelectric actuator 10 of the present embodiment. FIG. 4 is a drawing illustrating the relationship between drive voltage and displacement.

FIG. 4 depicts the relationship between a drive voltage and an amplitude of the swing (i.e., displacement) of a cantilever utilizing a related-art single-piezoelectric-layer actuator and the relationship between a drive voltage and an amplitude of the swing (i.e., displacement) of a cantilever utilizing the piezoelectric actuator 10.

In FIG. 4, a dotted line represents the relationship between a drive voltage and an amplitude of the swing of a cantilever utilizing the related-art piezoelectric actuator, and a solid line represents the relationship between a drive voltage and an amplitude of the swing of a cantilever utilizing the piezoelectric actuator 10 of the present embodiment. The drive voltage illustrated in FIG. 4 is an alternating voltage of 250 Hz. The amplitude of the swing was measured by use of a Doppler vibration meter or the like.

As illustrated In FIG. 4, the cantilever utilizing the piezoelectric actuator 10 of the present embodiment can provide about the same amplitude of the swing as the cantilever utilizing the related-art piezoelectric actuator by use of approximately half the drive voltage applied to the related-art piezoelectric actuator. Specifically, in order to obtain the amplitude of the swing that is 4 um, the cantilever utilizing the related-art piezoelectric actuator may need a drive voltage of approximately 45 V. On the other hand, the cantilever utilizing the piezoelectric actuator 10 produces a swing amplitude of 4 um by use of a drive voltage of approximately 20 V. The use of the piezoelectric actuator 10 of the present embodiment thus achieves reduction in drive voltage.

Figure 5:
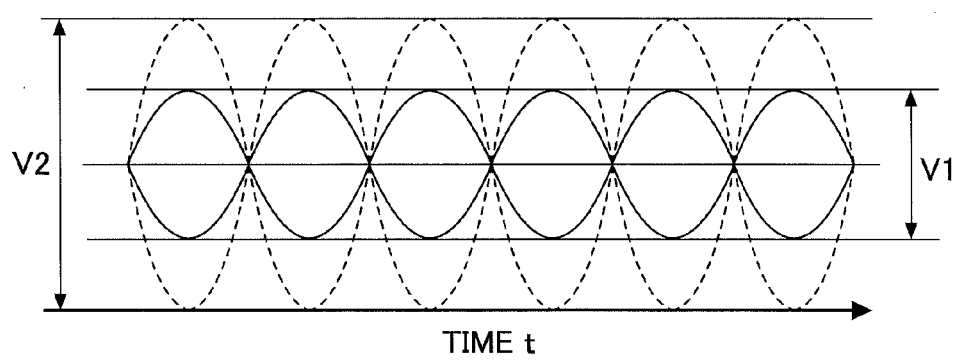
FIG. 5 is a drawing illustrating drive voltage applied to a piezoelectric actuator.

FIG. 5 is a drawing illustrating drive voltage applied to a piezoelectric actuator. In FIG. 5, dotted-line waves represent drive voltage applied to the related-art piezoelectric actuator, and solid-line waves represent drive voltage applied to the piezoelectric actuator 10 of the present embodiment.

In FIG. 5, the amplitude of the drive voltage applied to the piezoelectric actuator 10 is V1, and the amplitude of the drive voltage applied to the related-art piezoelectric actuator is V2. In this case, V1 is approximately equal to V2/2.

In this manner, the use of the piezoelectric actuator 10 of the present embodiment serves to reduce the drive voltage by about a half, compared with the related-art single-piezoelectric-layer actuator.

The present embodiment is directed to an example in which the number of piezoelectric material layers provided in the piezoelectric actuator 10 is two. This example is non-limiting. The piezoelectric actuator 10 of the present embodiment may have four piezoelectric material layers or six piezoelectric material layers.

Second Embodiment

In the following, a second embodiment will be described with reference to the accompanying drawings. The second embodiment is directed to an optical scanning apparatus utilizing the piezoelectric actuator 10 of the first embodiment. In the second embodiment, elements having the same or similar functional configurations as those of the first embodiment are referred to by the same or similar numerals, and a description thereof will be omitted.

Figure 6:
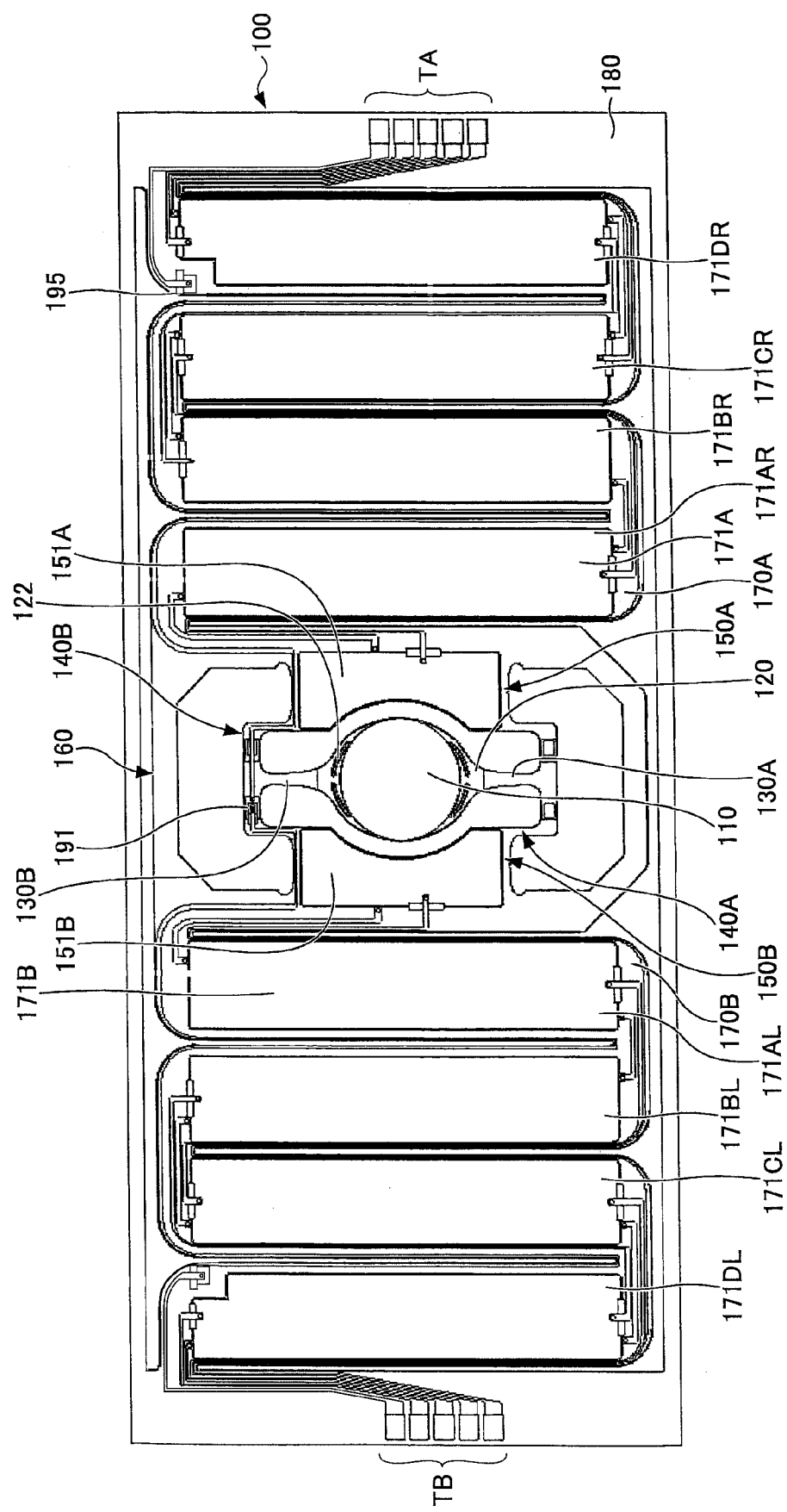
FIG. 6 is a drawing illustrating an optical scanning apparatus according to a second embodiment.

FIG. 6 is a drawing illustrating an optical scanning apparatus according to the second embodiment.

An optical scanning apparatus 100 of the present embodiment includes a mirror 110, a mirror support part 120, twist beams 130A and 130B, connection beams 140A and 140B, first drive beams 150A and 150B, a movable frame 160, second drive beams 170A and 170B, and a fixed frame 180. The first drive beams 150A and 150B of the present embodiment are provided with drive units 151A and 151B, respectively. The second drive beams 170A and 170B are provided with drive units 171A and 171B, respectively.

The mirror support part 120 of the present embodiment has slits 122 formed therein that extend along the circumference of the mirror 110. The slits 122 serve to reduce the weight of the mirror support part 120 and to absorb stress while transmitting twist from the twist beams 130A and 130B to the mirror 110.

In the optical scanning apparatus 100 of the present embodiment, the mirror 110 is supported on the surface of the mirror support part 120, which is connected to one end of each of the twist beams 130A and 130B situated on either side thereof. The twist beams 130A and 130B constitute a swing axis, and extend along the axial direction to support the mirror support part 120 at both ends on the axis. The twist beams 130A and 130B twist to swing the mirror 110 supported on the mirror support part 120, thereby scanning the light shining on and reflected by the mirror 110. The twist beams 130A and 130B are connected to and supported by the connection beams 140A and 140B, respectively, and are thus ultimately connected to the first drive beams 150A and 150B.

The first drive beams 150A and 150B, the connection beams 140A and 140B, the twist beams 130A and 130B, the mirror support part 120, and the mirror 110 are surrounded by the movable frame 160. Each of the first drive beams 150A and 150B has one end thereof supported by the movable frame 160. The other end of the first drive beam 150A extends on the inner side thereof to be connected to the connection beams 140A and 140B. The other end of the first drive beam 150B also extends on the inner side thereof to be connected to the connection beams 140A and 140B.

The first drive beams 150A and 150B form a pair, and are placed on both sides of the mirror 110 and the mirror support part 120 in the direction perpendicular to the direction in which the twist beams 130A and 130B extend.

The drive units 151A and 151B are formed on the surfaces of the first drive beams 150A and 150B, respectively. The drive units 151A and 151B each include the lower electrode 20, the piezoelectric material 12, the middle electrode 30, the piezoelectric material 13, and the upper electrode 40 formed on the surfaces of the first drive beams 150A and 150B, respectively. In the drive units 151A and 151B, the piezoelectric materials exhibit expansions and contractions in response to the polarity of drive voltage applied between the middle electrode 30 and both the lower electrode 20 and the upper electrode 40. Drive voltages having different polarities may be applied to the first drive beams 150A and 150B, respectively. In such a case, the first drive beams 150A and 150B oscillate to move in opposite vertical directions on the right and left sides of the mirror 110, so that the mirror 110 rotationally swings around the swing or rotation axis that is provided by the twist beams 130A and 130B. The direction in which the mirror 110 rotationally swings around the axis of the twist beams 130A and 130B is hereinafter referred to as a horizontal direction. Resonant oscillation may be used for horizontal drive exerted by the first drive beams 150A and 150B, thereby achieving high-speed swinging of the mirror 110.

One end of each of the second drive beams 170A and 170B is connected to an exterior side of the movable frame 160. The second drive beams 170A and 170B form a pair, and are placed on the right-hand side and left-hand side of the movable frame 160, respectively. The second drive beam 170A includes beams each extending in parallel to the first drive beam 150A. Each of the beams is connected at one end thereof to an adjacent one of the beams so that the series-connected beams are arranged in a zigzag form. The other end of the second drive beam 170A is connected to an interior side of the fixed frame 180. Similarly, the second drive beam 170A also includes beams each extending in parallel to the first drive beam 150B. Each of the beams is connected at one end thereof to an adjacent one of the beams so that the series-connected beams are arranged in a zigzag form. The other end of the second drive beam 170B is connected to an interior side of the fixed frame 180.

The drive units 171A and 171B are formed on the surfaces of the second drive beams 170A and 170B, respectively, in rectangular forms that do not have a curved part. The drive unit 171A includes the lower electrode 20, the piezoelectric material 12, the middle electrode 30, the piezoelectric material 13, and the upper electrode 40 formed on the surface of the second drive beam 170A. The drive unit 171B includes the lower electrode 20, the piezoelectric material 12, the middle electrode 30, the piezoelectric material 13, and the upper electrode formed on the surface of the second drive beam 170B.

Drive voltages having different polarities are applied to adjacent rectangular units of the drive units 171A and 171E on the second drive beams 170A and 170B, so that adjacent rectangular beams are bent in opposite vertical directions, thereby transmitting accumulated vertical movements of the individual rectangular beams to the movable frame 160. Through these movements, the second drive beams 170A and 170B swing the mirror 110 in the vertical direction perpendicular to the horizontal direction. Resonant oscillation may be used for vertical drive exerted by the second drive beams 170A and 170B.

The drive unit 171B includes drive units 171DL, 171CL, 171BL, and 171AL in this order from left to right toward movable frame 160. The drive unit 171A on the right-hand side includes drive units 171AR, 171BR, 171CR, and 171DR in this order from left to right from the movable frame 160. In this case, the drive units 171Ax and the drive units 171Cx (i.e., four units in total) are driven by a single common waveform, and the drive units 171Bx and the drive units 171Dx (i.e., four units in total) are driven by a single common waveform that has a different phase than the former waveform, thereby achieving vertical swinging motion. The drive units 171Ax, 171Bx, 171Cx, and 171Dx of the present embodiment each include the piezoelectric material 12, the piezoelectric material 13, the lower electrode 20, the middle electrode 30, and the upper electrode 40 similarly to the drive units 171A and 171B.

In the optical scanning apparatus 100 of the present embodiment, the piezoelectric actuator 10 of the first embodiment having two piezoelectric material layers is used as the drive units 151A, 151B, 171A, and 171B as described above. With this arrangement, the present embodiment can decrease by half the drive voltage applied to the 151A, 151B, 171A, and 171B.

In the optical scanning apparatus 100 of the present embodiment, a piezoelectric sensor 191 is provided on the connection beam 140B to detect an angle of the mirror 110 in the horizontal direction when the mirror 110 rotationally swings in the horizontal direction.

In the present embodiment, the piezoelectric sensor 191 may detect the angle of the mirror 110 in the horizontal direction, so that the drive voltage may be controlled based on the detected results. In the optical scanning apparatus 100 of the present embodiment, a drive wire is provided to supply a piezoelectric-sensor drive voltage for driving the piezoelectric sensor 191, and a sensor wire is provided that extends from the piezoelectric sensor 191. The drive wire and the sensor wire are connected to a set of terminals TA or TB. The sets of terminals TA and TB are used for connecting the optical scanning apparatus 100 to an optical scanning control apparatus 200 that will be described later.

In the present embodiment, the piezoelectric sensor 195 for detecting an angle of the mirror 110 in the vertical direction when the mirror 110 swings in the vertical direction may be situated on one of the rectangular beams of the second drive beam 170A.

Figure 7:
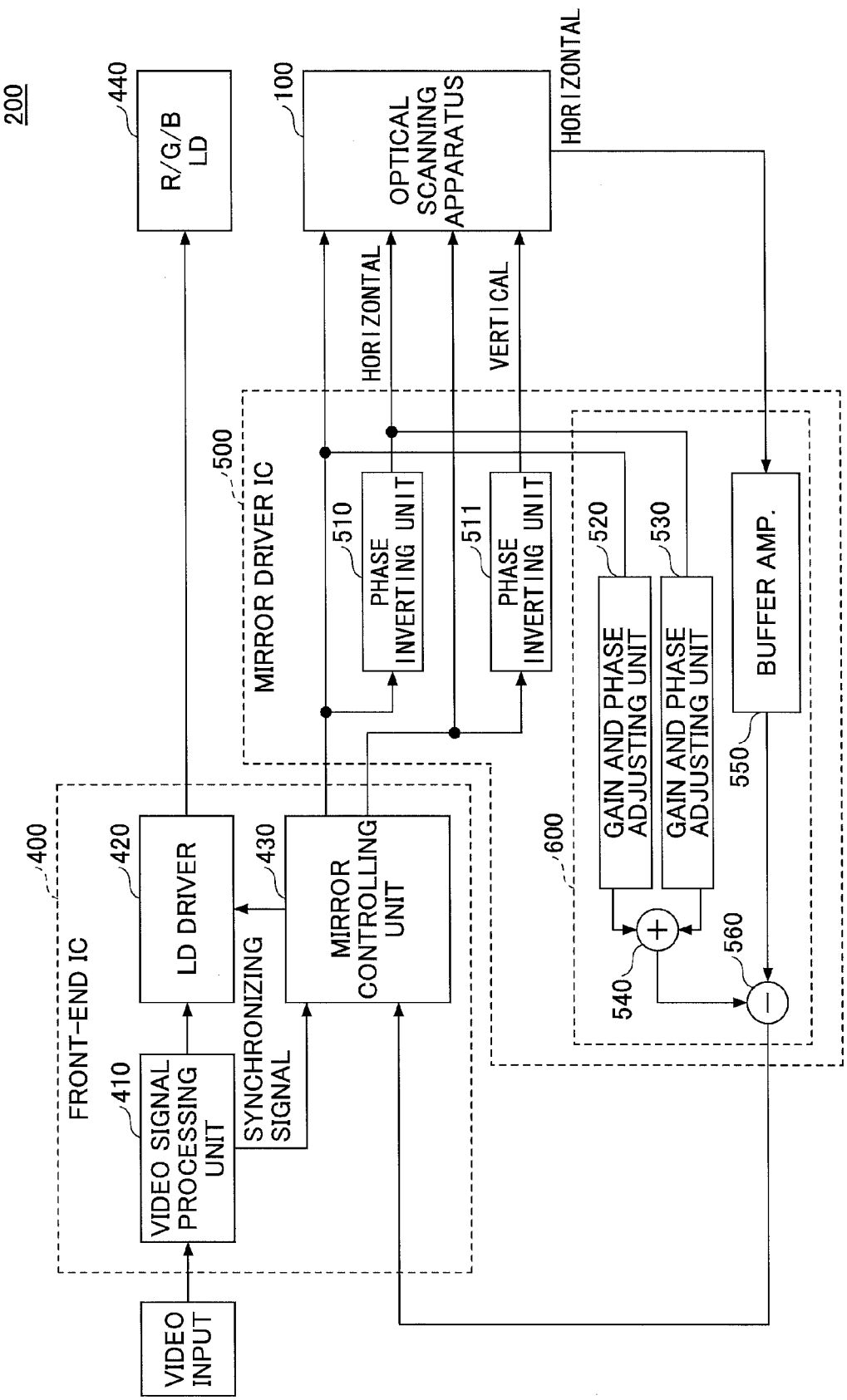
FIG. 7 is a drawing illustrating an optical scanning control apparatus according to the second embodiment.

The optical scanning control apparatus 200 of the present embodiment will now be described by referring to FIG. 7. FIG. 7 is a drawing illustrating the optical scanning control apparatus according to the second embodiment.

The optical scanning control apparatus 200 of the present embodiment includes the optical scanning apparatus 100, a front-end IC (integrated circuit) 400, an LD (laser diode) 440, and a mirror driver IC 500.

The front-end IC 400 of the present embodiment processes video signals supplied thereto, and sends the processed signals to the LD 440. Further, the front-end IC 400 of the present embodiment supplies a signal for controlling the swinging of the mirror 110 to the optical scanning apparatus 100.

The front-end IC 400 of the present embodiment includes a video signal processing unit 410, an LD driver 420, and a mirror controlling unit 430. The video signal processing unit 410 separates the synchronizing signals, luminance signal, and chromaticity signals from each other included in the supplied video signals. The video signal processing unit 410 supplies the luminance signal and the chromaticity signals to the LD driver 420, and supplies the synchronizing signals to the mirror controlling unit 430.

The LD driver 420 controls the LD 440 based on the signals supplied from the video signal processing unit 410.

The mirror controlling unit 430 controls the swinging of the mirror 110 based on the synchronizing signals and the output of the piezoelectric sensor 191 output from the mirror driver IC 500. More specifically, the mirror controlling unit 430 uses the mirror driver IC 500 to produce drive voltages (i.e., drive signals) for driving the drive units 151A and 151B of the optical scanning apparatus 100

The mirror driver IC 500 of the present embodiment includes phase inverting units 510 and 511 and a noise removal unit 600.

The phase inverting units 510 and 511 invert the phases of the drive signals supplied from the mirror controlling unit 430. Specifically, the phase inverting unit 510 inverts the phase of the drive signal supplied to the drive unit 151A to produce the phase-inverted signal, which is supplied as the drive signal to the drive unit 151B. The phase inverting unit 511 inverts the phase of the drive signal supplied to the drive unit 171A to produce the phase-inverted signal, which is supplied as the drive signal to the drive unit 171B.

The noise removal unit 600 of the present embodiment reduces noise included in the output of the piezoelectric sensor 191. The noise included in the output of the piezoelectric sensor 191 is generated by crosstalk with the drive signals supplied to the drive units 151A, 151B, 171A, and 171B due to the length and distance of the drive wires.

The noise removal unit 600 removes noise received from the drive signals supplied to the drive units 151A and 151B. The optical scanning control apparatus 200 of the present embodiment may be provided with a noise removal unit that removes noise received from the drive signals supplied to the drive units 171A and 171B. The noise removal unit for the drive units 171A and 171B may have the same configuration as the noise removal unit 600.

The noise removal unit 600 of the present embodiment includes gain and phase adjusting units 520 and 530, an adder circuit 540, a buffer 550, and a subtraction circuit 560.

The gain and phase adjusting units 520 and 530 generate, from the drive signals supplied to the drive units 151A and 151B, respectively, signals equivalent to noises included in the output of the piezoelectric sensor 191. In the following description, the drive signal supplied to the drive unit 151A is referred to as a drive signal 1, and the drive signal supplied to the drive unit 151B is referred to as a drive signal 2.

The gain and phase adjusting unit 520 of the present embodiment generates a signal equivalent to noise included in the output of the piezoelectric sensor 191 when the drive signal 1 is applied to the drive unit 151A. The gain and phase adjusting unit 530 of the present embodiment generates a signal equivalent to noise included in the output of the piezoelectric sensor 191 when the drive signal 2 is applied to the drive unit 151B.

The adder circuit 540 obtains the sum of the outputs of the gain and phase adjusting units 520 and 530, and the obtained sum is then inverted. In the present embodiment, the outputs of the gain and phase adjusting units 520 and 530 are added together, and the resulting sum is inverted. With this arrangement, a signal equivalent to noises included in the output of the piezoelectric sensor 191 is generated when the drive signals 1 and 2 are simultaneously supplied to the drive units 151A and 151B, respectively.

The buffer 550 amplifies the output of the piezoelectric sensor 191. In the present embodiment, only one piezoelectric sensor, i.e., the piezoelectric sensor 191, is provided in the optical scanning apparatus 100. The piezoelectric sensor 191 outputs an electric current responsive to the displacement of the connection beam 140B propagating from the twist beam 130B in response to the angle of the mirror 110 in the horizontal direction.

The subtraction circuit 560 subtracts the output of the adder circuit 540 from the output of the buffer 550. The output of the buffer 550 of the present embodiment is a signal that includes both noise and the output of the piezoelectric sensor 191. The output of the adder circuit 540 is a signal that is equivalent to the noise included in the output of the piezoelectric sensor 191. Subtracting the output of the adder circuit 540 from the output of the buffer 550 thus serves to remove the noise from the output of the piezoelectric sensor 191. The output of the subtraction circuit 560 is supplied as the output of the noise removal unit 600 to the mirror controlling unit 430 of the front-end IC 400. Based on the output of the noise removal unit 600, the mirror controlling unit 430 produces drive signals.

Control of the drive signals in the present embodiment as described above ensures that the swing of the mirror 110 is properly controlled.

In the present embodiment, the piezoelectric sensor 191 may also include the lower electrode 20, the piezoelectric material 12, the middle electrode 30, the piezoelectric material 13, and the upper electrode 40.

In the optical scanning control apparatus 200 of the present embodiment as described above, the piezoelectric actuator 10 of the first embodiment is used as the drive units 151A, 151B, 171A, and 171B, thereby allowing a reduction to be made in the drive voltage supplied to the mirror 110. Further, the piezoelectric sensor 191 of the present embodiment has the configuration of the piezoelectric actuator 10 of the first embodiment, thereby allowing the sensor output to be increased. Moreover, in the present embodiment, the removal of noise from the sensor output ensures the provision of a highly accurate sensor output.

Third Embodiment

In the following, a third embodiment will be described with reference to the accompanying drawings. The third embodiment differs from the first and second embodiments in that the upper electrode and the lower electrode of a piezoelectric actuator are electrically connected to the substrate. In the description of the third embodiment in the following, differences from the first embodiment will be described. The same or similar elements as those of the first embodiment are referred to by the same or similar reference symbols, and a description thereof will be omitted.

Figure 8:
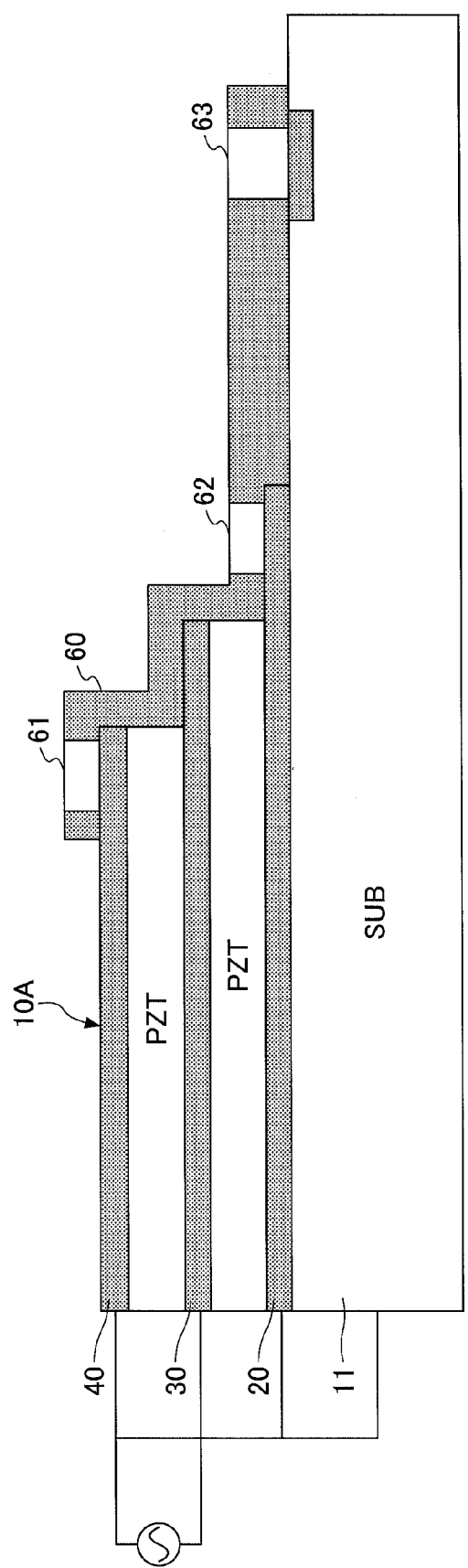
FIG. 8 is a drawing illustrating the configuration of a piezoelectric actuator according to a third embodiment.

FIG. 8 is a drawing illustrating the configuration of a piezoelectric actuator according to the third embodiment. The piezoelectric actuator 10A of the present embodiment has the upper electrode 40 and the lower electrode 20 electrically connected to the ground, and has the middle electrode 30 that receives a drive signal for driving the piezoelectric actuator 10A. The middle electrode 30 is displaced in response to the voltage of the drive signal as it is supplied thereto.

In the piezoelectric actuator 10A of the present embodiment, the upper electrode 40 and the lower electrode 20 are electrically connected to the substrate 11 through an interconnection 60. A connection-purpose electrode 61 is formed on the upper electrode 40 of the present embodiment. A connection-purpose electrode 62 is formed on the lower electrode 20. A connection-purpose electrode 63 is formed on the substrate 11 of the present embodiment. The upper electrode 40, the lower electrode 20, and the substrate 11 of the present embodiment are connected together through the electrodes 61, 62, and 63 and the interconnection 60.

Figure 9:
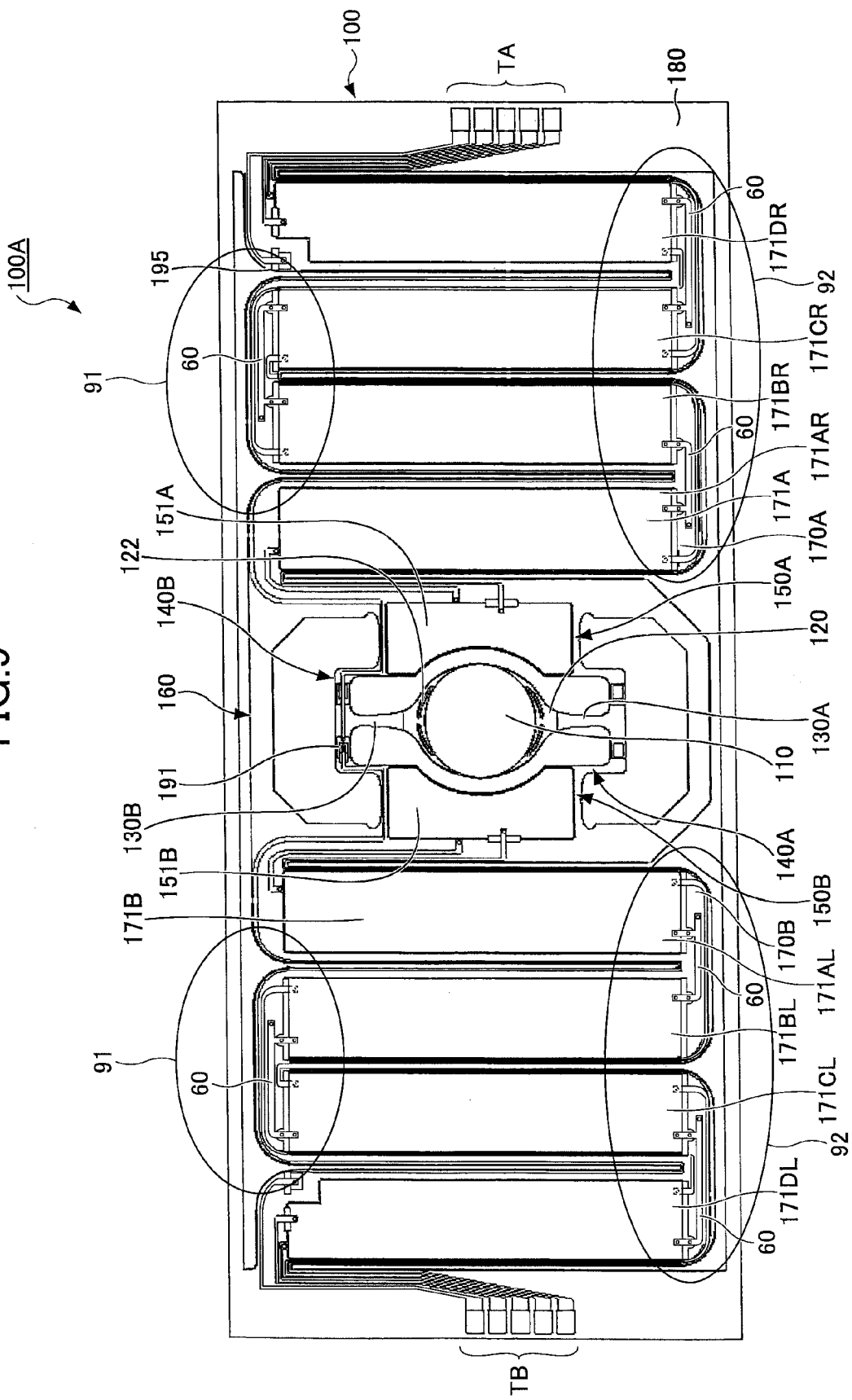
FIG. 9 is a drawing illustrating an optical scanning apparatus according to the third embodiment.

In the following, a description will be given of the optical scanning apparatus utilizing the piezoelectric actuator 10A of the present embodiment by referring to FIG. 9. FIG. 9 is a drawing illustrating an optical scanning apparatus according to the third embodiment.

In the present embodiment, the fact that noises generated by the drive wires for supplying drive signals to the drive units 171A and 171B are included in the output of the piezoelectric sensor 195 through the substrate 11 is taken into account, thereby resulting in the arrangement in which the piezoelectric actuator 10A is utilized as the drive units 171A and 171B for the purpose of noise reduction.

Namely, in respect of the drive units 171A and 171B of the present embodiment, the upper electrode 40 and the lower electrode 20 formed on the surfaces of the second drive beams 170A and 170B are connected to the substrate 11 through the interconnection 60.

In the optical scanning apparatus 100A of the present embodiment, the piezoelectric actuator 10A of the present embodiment is used as the drive units 171A and 171B, thereby reducing noise included in the output of the piezoelectric sensor 195 for detecting a vertical angle. The above-noted noise in the present embodiment is generated by crosstalk due to the length and distance of the drive wires for supplying drive signals.

In the following, a description will be given of the interconnection 60 of the present embodiment by referring to FIG. 10 and FIG. 11, which are enlarged views of a portion 91 and a portion 92 of FIG. 9, respectively.

Figure 10:
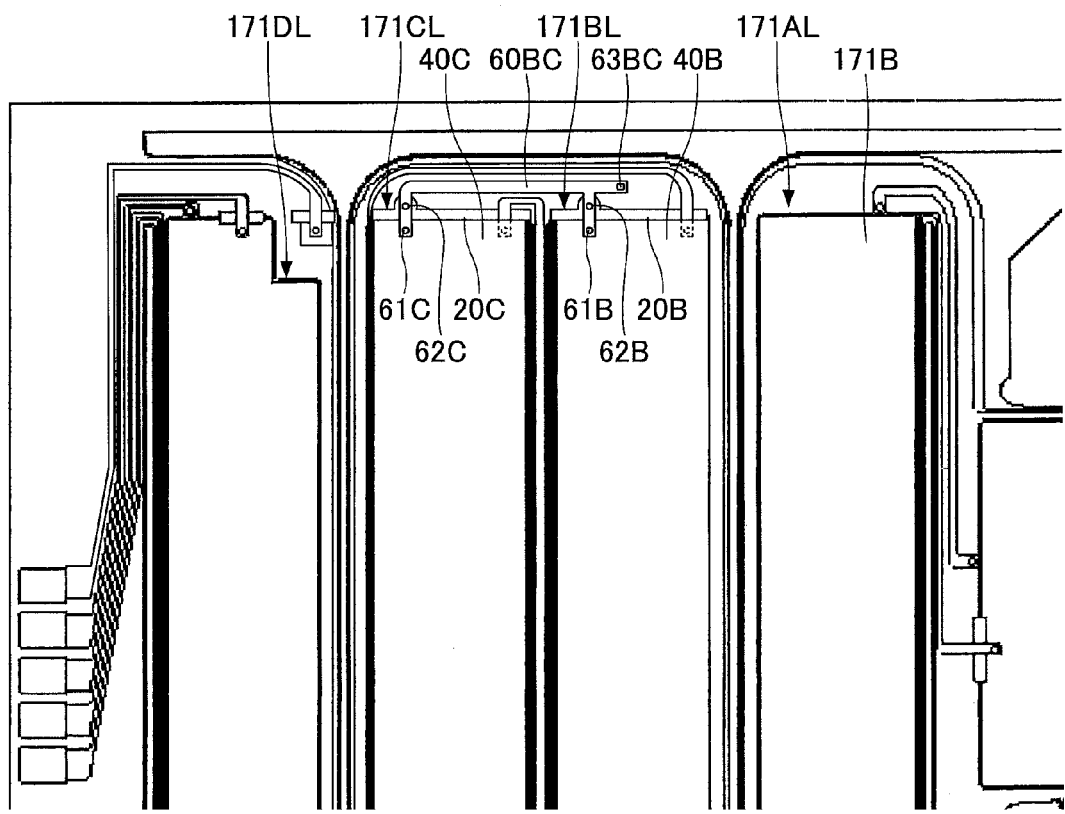
FIG. 10 is an enlarged view of a portion of FIG. 9.

FIG. 10 is an enlarged view of the portion 91.

FIG. 10 illustrates an interconnection 60BC connecting the upper electrode 40 and the lower electrode 20 to the substrate 11 in the drive units 171BL and 171CL included in the drive unit 171B.

The drive unit 171BL has an upper electrode 40B and a lower electrode 20B. The upper electrode 40B is connected to the interconnection 60BC through a contact hole 61B. The lower electrode 20B is connected to the interconnection 60BC through a contact hole 62B. The interconnection 60BC to which the upper electrode 40B and the lower electrode 20B are connected is connected to the substrate 11 through a contact hole 63BC.

The drive unit 171CL has an upper electrode 40C and a lower electrode 20C. The upper electrode 40C is connected to the interconnection 60BC through a contact hole 61C. The lower electrode 20C is connected to the interconnection 60BC through a contact hole 62C. The interconnection 60BC to which the upper electrode 40C and the lower electrode 20C are connected is connected to the substrate 11 through the contact hole 63BC.

Accordingly, the drive units 171BL and 171CL have the upper electrode 40 and the lower electrode 20 thereof connected to the substrate 11 through the interconnection 60BC, so that the potential of the upper electrode 40 and the lower electrode 20 is set equal to the potential of the substrate 11.

Figure 11:
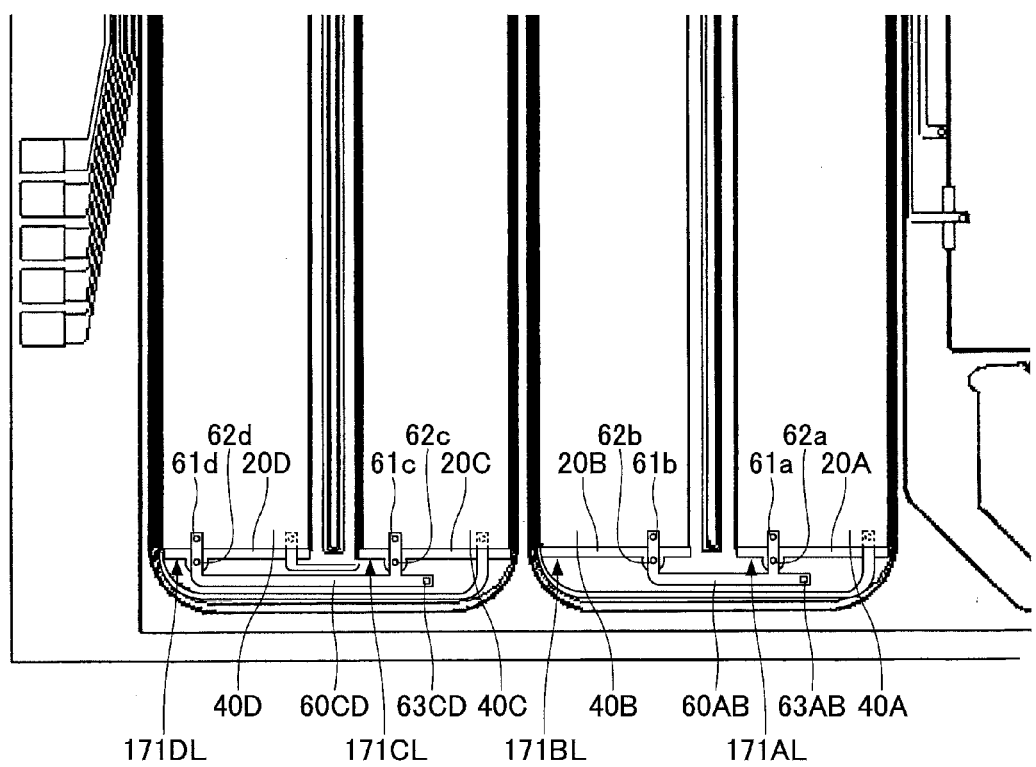
FIG. 11 is an enlarged view of a portion of FIG. 9.

FIG. 11 is an enlarged view of the portion 92.

FIG. 11 illustrates an interconnection 60AB connecting the upper electrode 40 and the lower electrode 20 to the substrate 11 in the drive units 171AL and 171BL. FIG. 11 illustrates an interconnection 60CD connecting the upper electrode 40 and the lower electrode 20 to the substrate 11 in the drive units 171CL and 171DL included in the drive unit 171B.

The drive unit 171AL has an upper electrode 40A and a lower electrode 20A. The upper electrode 40A is connected to the interconnection 60AB through a contact hole 61a. The lower electrode 20A is connected to the interconnection 60AB through a contact hole 62a. The interconnection 60AB to which the upper electrode 40A and the lower electrode 20A are connected is connected to the substrate 11 through a contact hole 63AB.

In the drive unit 171BL, the upper electrode 40B is connected to the interconnection 60AB through a contact hole 61b. The lower electrode 20B is connected to the interconnection 60AB through a contact hole 62b.

Accordingly, the drive units 171AL and 171BL have the upper electrode 40 and the lower electrode 20 thereof connected to the substrate 11 through the interconnection 60AB, so that the potential of the upper electrode 40 and the lower electrode 20 is set equal to the potential of the substrate 11.

The drive unit 171DL has an upper electrode 40D and a lower electrode 20D. The upper electrode 40D is connected to the interconnection 60CD through a contact hole 61d. The lower electrode 20D is connected to the interconnection 60CD through a contact hole 62d. The interconnection 60CD to which the upper electrode 40D and the lower electrode 20D are connected is connected to the substrate 11 through a contact hole 63CD.

In the drive unit 171CL, the upper electrode 40C is connected to the interconnection 60CD through a contact hole 61c. The lower electrode 20C is connected to the interconnection 60CD through a contact hole 62c.

Accordingly, the drive units 171CL and 171DL have the upper electrode 40 and the lower electrode 20 thereof connected to the substrate 11 through the interconnection 60CD, so that the potential of the upper electrode 40 and the lower electrode 20 is set equal to the potential of the substrate 11.

In the present embodiment, the upper electrode 40B of the drive unit 171BL is connected to the substrate 11 through the contact holes 61B and 61b, and the lower electrode 20B is connected to the substrate 11 through the contact holes 62B and 62b. Further, the upper electrode 40C of the drive unit 171CL of the present embodiment is connected to the substrate 11 through the contact holes 61C and 61c, and the lower electrode 20C is connected to the substrate 11 through the contact holes 62C and 62c.

In the present embodiment, each of the upper electrode 40 and the lower electrode 20 is connected through a plurality of connecting points to the substrate 11 in the piezoelectric actuator 10A, thereby suppressing the generation of uneven electrical resistance at the connecting points.

FIGS. 12A through 12F are drawings illustrating the waveforms of the output of a piezoelectric sensor that detects an angle with respect to the vertical axis.

Figure 12C:
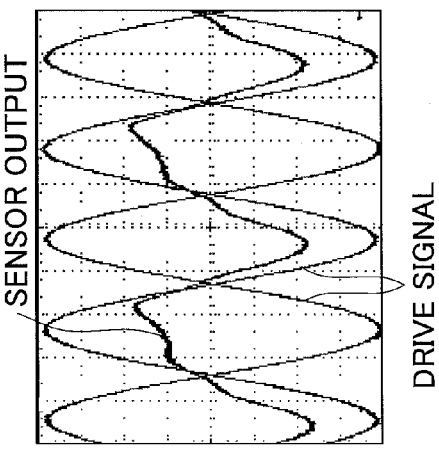
FIGS. 12A through 12F are drawings illustrating the waveforms of the output of a piezoelectric sensor that detects an angle with respect to a vertical axis.
Figure 12B:
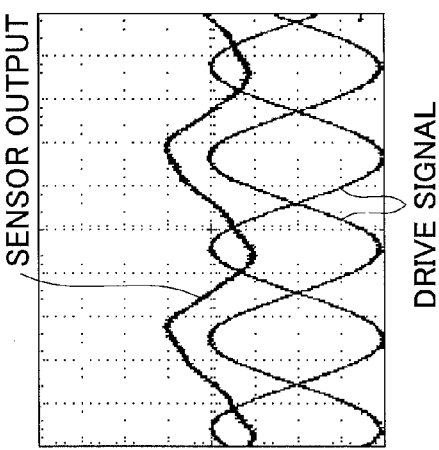
Figure 12A:
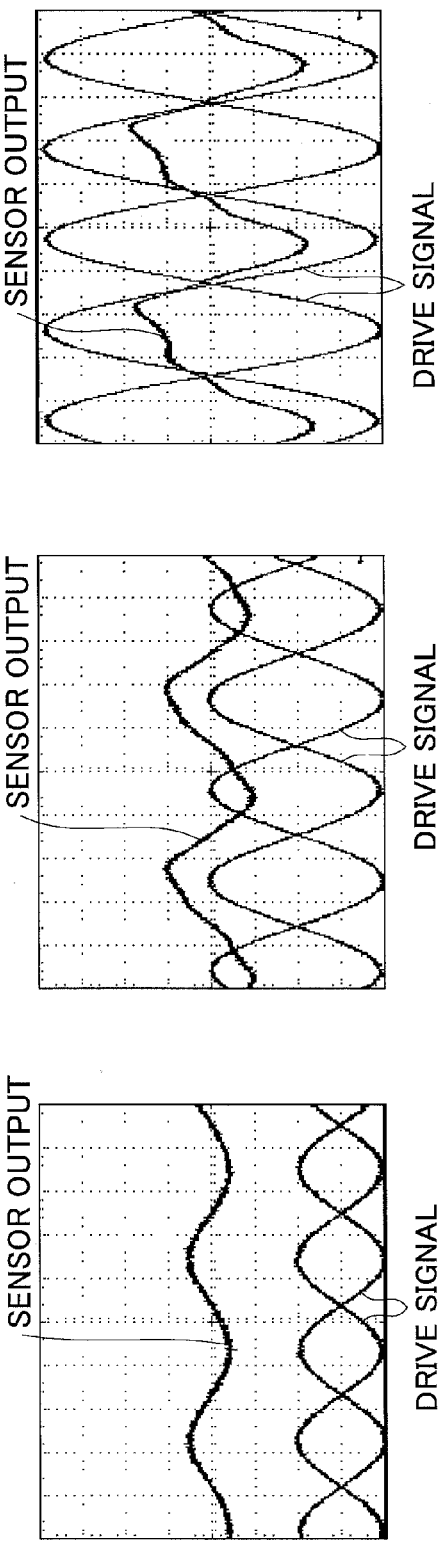
Figure 12F:
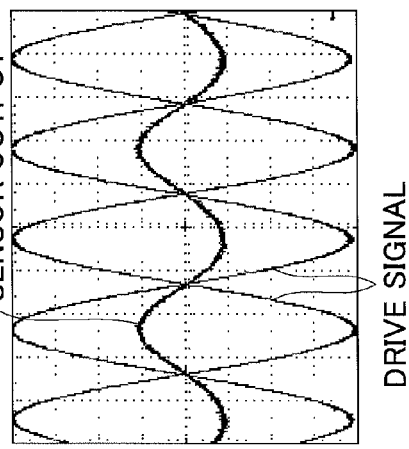
Figure 12E:
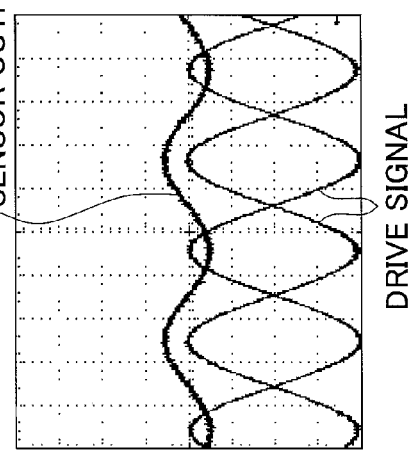
Figure 12D:
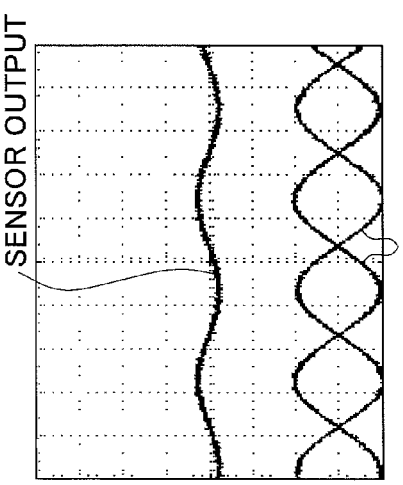

FIGS. 12A and 12D illustrate the waveforms of the output of the piezoelectric sensor 195 observed when the peak-to-peak potential difference of a drive voltage is 10 Vp-p. FIGS. 12B and 12E illustrate the waveforms of the output of the piezoelectric sensor 195 observed when the peak-to-peak potential difference of a drive voltage is 20 Vp-p. FIGS. 12C and 12F illustrate the waveforms of the output of the piezoelectric sensor 195 observed when the peak-to-peak potential difference of a drive voltage is 40 Vp-p.

FIGS. 12A, 12B, and 12C illustrate cases in which the piezoelectric actuator 10A is not used, and FIGS. 12D, 12E, and 12F illustrate cases in which the piezoelectric actuator 10A is used.

As illustrated in FIGS. 12A, 12B, and 12C, the waveform of the output of the piezoelectric sensor 195 has distortion that increases with an increase in the drive voltage.

In the case of the piezoelectric actuator 10A being used, on the other hand, no distortion occurs as illustrated in FIGS. 12D, 12E, and 12F.

In this manner, noise included in the output of the piezoelectric sensor 195 is reduced in the optical scanning apparatus 100A of the present embodiment.

Although the present embodiment has been described with reference to the example in which the upper electrode 40 and the lower electrode 20 of the piezoelectric actuator 10A are electrically connected to the substrate 11, this is not a limiting example. For example, the middle electrode 30 may be connected to the substrate 11 serving as a ground, and a drive signal may be supplied to the upper electrode 40 and the lower electrode 20.

Although the invention has been described by referring to embodiments, the invention is not limited to the configurations of these embodiments. Various variations and modifications may be made without departing from the scope of the present invention, and may be made in accordance with applications.

The present application is based on Japanese priority applications No. 2012-213500 filed on Sep. 27, 2012 and No. 2013-174661 filed on Aug. 26, 2013 with the Japanese Patent Office, the entire contents of which are hereby incorporated by reference.

What is claimed is:

1. A piezoelectric actuator, comprising:
   a plurality of piezoelectric layers;
   a plurality of electrodes between which each of the piezoelectric layers is placed so that the electrodes and the piezoelectric layers alternate with each other; and
   a substrate on which the plurality of piezoelectric layers and the plurality of electrodes are formed,
   wherein the plurality of piezoelectric layers include a first piezoelectric layer and a second piezoelectric layer,
   wherein the plurality of electrodes include:
      a lower electrode formed on the substrate, the first piezoelectric layer being formed on the lower electrode;
      a middle electrode formed on the first piezoelectric layer, the second piezoelectric layer being formed on the middle electrode; and
      an upper electrode formed on the second piezoelectric layer, and
   the piezoelectric actuator further comprising:
   a first connection-purpose electrode disposed in a contact hole on an upper surface of the substrate;
   a second connection-purpose electrode disposed in a contact hole on an upper surface of the lower electrode;
   a third connection-purpose electrode disposed in a contact hole on an upper surface of the upper electrode; and
   a wire disposed on, and extending along, the upper surface of the substrate, on a lateral face of the first piezoelectric layer, and on a lateral face of the second piezoelectric layer,
   wherein the first-connection-purpose electrode, the second connection-purpose electrode, and the third connection-purpose electrode are electrically coupled to each other to be set to the same potential through the wire.

2. The piezoelectric actuator as claimed in claim 1, wherein each of the plurality of electrodes is a film that includes a plurality of layers.

3. The piezoelectric actuator as claimed in claim 1, wherein each of the lower electrode and the middle electrode is a film of three layers, and the upper electrode is a film of two layers.

4. The piezoelectric actuator as claimed in claim 3, wherein each of the lower electrode and the middle electrode includes:

a first layer formed toward the substrate, the first layer being a film that has a perovskite structure and that includes a (110) orientation;

a second layer formed on the first layer, the second layer being a thin film that includes a platinum group metal; and a third layer formed on the second layer, the third layer being a film that has a perovskite structure and that includes a (110) orientation.

5. The piezoelectric actuator as claimed in claim 1, wherein an electrode that is one of the plurality of electrodes is connected to a ground and connected to the substrate.

6. The piezoelectric actuator as claimed in claim 1, wherein the upper electrode and the lower electrode are connected to a ground.

7. An optical scanning apparatus for rotationally swinging a mirror support part supporting a mirror around a rotational axis through twist of twist beams that support the mirror support part on both ends thereof on the rotational axis, comprising:

two first drive beams disposed on respective sides of the mirror and the mirror support part;

connection beams configured to connect one side of each of the first drive beams to the twist beams;

a movable frame configured to surround the mirror, the mirror support part, the twist beams, the first drive beams, and the connection beams; and first drive units disposed on the first drive beams, respectively, wherein each the first drive units includes:

a plurality of piezoelectric layers;

a plurality of electrodes between which each of the piezoelectric layers is placed so that the electrodes and the piezoelectric layers alternate with each other; and a substrate on which the plurality of piezoelectric layers and the plurality of electrodes are formed, wherein the plurality of piezoelectric layers include a first piezoelectric layer and a second piezoelectric layer, wherein the plurality of electrodes include:

a lower electrode formed on the substrate, the first piezoelectric layer being formed on the lower electrode;

a middle electrode formed on the first piezoelectric layer, the second piezoelectric layer being formed on the middle electrode; and an upper electrode formed on the second piezoelectric layer, and the piezoelectric actuator further comprising:

a first connection-purpose electrode disposed in a contact hole on an upper surface of the substrate;

a second connection-purpose electrode disposed in a contact hole on an upper surface of the lower electrode;

a third connection-purpose electrode disposed in a contact hole on an upper surface of the upper electrode; and a wire disposed on, and extending along, the upper surface of the substrate, on a lateral face of the first piezoelectric layer, and on a lateral face of the second piezoelectric layer, wherein the first-connection-purpose electrode, the second connection-purpose electrode, and the third connection-purpose electrode are electrically coupled to each other to be set to the same potential through the wire.

8. The optical scanning apparatus as claimed in claim 7, further comprising:

two second drive beams disposed on respective sides of the movable frame to swing the mirror and the mirror support part in a direction perpendicular to the rotational axis; and second drive units disposed on the second drive beams, respectively, wherein each the second drive units includes:

a plurality of piezoelectric layers;

a plurality of electrodes between which each of the piezoelectric layers is placed so that the electrodes and the piezoelectric layers alternate with each other; and a substrate on which the plurality of piezoelectric layers and the plurality of electrodes are formed.

9. The optical scanning apparatus as claimed in claim 7, wherein an electrode that is one of the plurality of electrodes is connected to a ground and connected to the substrate.

\* \* \* \* \*